United States Patent
Mitsui et al.

(10) Patent No.: US 8,994,132 B2
(45) Date of Patent: Mar. 31, 2015

(54) PHOTOELECTRIC CONVERSION ELEMENT, SOLID-SATE IMAGING ELEMENT, IMAGING APPARATUS, AND METHOD FOR MANUFACTURING PHOTOELECTRIC CONVERSION ELEMENT

(75) Inventors: Tetsuro Mitsui, Kanagawa (JP); Yuki Kuramoto, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 596 days.

(21) Appl. No.: 13/245,603

(22) Filed: Sep. 26, 2011

(65) Prior Publication Data
US 2012/0074513 A1    Mar. 29, 2012

(30) Foreign Application Priority Data

Sep. 27, 2010 (JP) ................ 2010-216102
Aug. 2, 2011 (JP) ................ 2011-169650
Sep. 26, 2011 (JP) ................ 2011-209209

(51) Int. Cl.
H01L 27/14 (2006.01)
H01L 51/44 (2006.01)
H01L 27/30 (2006.01)
H01L 51/42 (2006.01)

(52) U.S. Cl.
CPC ........... *H01L 51/442* (2013.01); *H01L 27/301* (2013.01); *H01L 51/4226* (2013.01); *Y02E 10/549* (2013.01)
USPC ............... 257/431; 257/E31.124; 438/98

(58) Field of Classification Search
CPC ................ H01L 27/301; H01L 51/442
USPC ........... 257/431, 448, 462, E31.124; 438/98
See application file for complete search history.

(56) References Cited

U.S. PATENT DOCUMENTS

2011/0049492 A1*  3/2011  Sawaki et al. .............. 257/40
2013/0206966 A1*  8/2013  Mitsui et al. .............. 250/208.1

FOREIGN PATENT DOCUMENTS

| JP | 11-326038 A | 11/1999 |
| JP | 2000-297068 A | 10/2000 |
| JP | 2001-007367 A | 1/2001 |
| JP | 2005-085933 A | 3/2005 |
| JP | 2007-273555 A | 10/2007 |
| JP | 2008-072090 A | 3/2008 |

(Continued)

OTHER PUBLICATIONS

An Office Action; "Notice of Reasons for Rejection," issued by the Japanese Patent Office on Jun. 13, 2014, which corresponds to Japanese Patent Application No. 2011-209209 and is related to U.S. Appl. No. 13/245,603; with English language translation.

*Primary Examiner* — Jose R Diaz
(74) *Attorney, Agent, or Firm* — Studebaker & Brackett PC

(57) ABSTRACT

A photoelectric conversion element includes an insulating film, a first electrode, a light receiving layer, and a second electrode. The first electrode is formed on the insulating film and is made of titanium oxynitride. The light receiving layer is formed on the first electrode and includes an organic material. A composition of the first electrode just before forming the light receiving layer meets (1) a requirement that an amount of oxygen contained in the whole of the first electrode is 75 atm % or more of an amount of titanium, or (2) a requirement that in a range of from the substrate side of the first electrode to 10 nm or a range of from the substrate side of the first electrode to ⅔ of the thickness of the first electrode, an amount of oxygen is 40 atm % or more of an amount of titanium.

13 Claims, 2 Drawing Sheets

(56) References Cited

FOREIGN PATENT DOCUMENTS

| JP | 2008-072435 A | 3/2008 |
| JP | 2008-072589 A | 3/2008 |
| JP | 2008-263178 A | 10/2008 |
| JP | 4213832 B2 | 11/2008 |
| JP | 2009-071057 A | 4/2009 |
| JP | 2009-182095 A | 8/2009 |
| JP | 2010-093100 A | 4/2010 |
| WO | 2008/131313 A2 | 10/2008 |

* cited by examiner

PHOTOELECTRIC CONVERSION ELEMENT, SOLID-SATE IMAGING ELEMENT, IMAGING APPARATUS, AND METHOD FOR MANUFACTURING PHOTOELECTRIC CONVERSION ELEMENT

CROSS-REFERENCE TO RELATED APPLICATIONS

This application claims the benefit of Japanese Patent Application Nos. 2010-216102 (filed on Sep. 27, 2010), 2011-169650 (filed on Aug. 2, 2011), and 2011-209209 (filed on Sep. 26, 2011), the entire contents of which are hereby incorporated by reference.

BACKGROUND

1. Technical Field

The present invention relates to a photoelectric conversion element, a solid-state imaging element, an imaging apparatus, and a method for manufacturing a photoelectric conversion element.

2. Related Art

In general solid-state imaging elements having a photodiode within a semiconductor substrate, the pixel size reaches the limits of miniaturization, and an enhancement of performance such as sensitivity is becoming difficult. Then, there is proposed a stack type solid-state imaging element with high sensitivity in which a photoelectric conversion layer is provided above a semiconductor substrate, so as to enable one to achieve 100% of an aperture ratio (see JP-A-2008-263178).

The stack type solid-state imaging element described in JP-A-2008-263178 has a configuration in which plural pixel electrodes are arranged and formed above a semiconductor substrate, an organic material-containing light receiving layer (including at least a photoelectric conversion layer) is formed above the plural pixel electrodes, and a counter electrode is formed above this light receiving layer. In such a stack type solid-state imaging element, a bias voltage is impressed to the counter electrode, so as to add an electric field to the light receiving layer; a charge generated within the light receiving layer is transferred into the pixel electrodes; and a signal in response to the charge is read out by a read-out circuit connected to the pixel electrodes.

In the stack type solid-state imaging element, there may be the case where after forming the pixel electrodes, the light receiving layer and the counter electrode, for example, a protective film for blocking the outside air (e.g., water or oxygen), a color filter and other functional film, and so on are formed above the stack. In such case regarding a color filter, for example, the light receiving layer is coated with chemicals for the protective film, the color filter and other functional film, and also subjected to a heating step of heating generally at a temperature of about 200° C. for achieving curing.

Also, on the occasion of wire bonding for electrically connecting a substrate circuit and a package to each other and on the occasion of die bonding of chips to a package or solder reflow for connecting a package to an IC substrate, and the like, the heating step is performed. Furthermore, for achieving the wire bonding, it is necessary to provide a PAD opening in the chip circumferences and the like. On that occasion, resist pattern formation and etching are performed, and the substrate having the light receiving layer formed thereon goes through the heating step in each of the resist pattern formation step and the etching step.

In the light of the above, in the case where it is intended to fabricate a solid-state imaging element using an organic material-containing light receiving layer, when a processing method which is used for usual silicon devices is utilized, a high-temperature heating step is necessary, and the light receiving layer is required to endure such a heating step.

As a technique for enhancing the heat resistance of the light receiving layer, the use of a material having a small thermal change (for example, a material having a high glass transition temperature Tg) is generally applied. However, since the light receiving layer is required to have not only heat resistance but characteristics such as high photoelectric conversion efficiency and low dark current, it is necessary to select a material capable of satisfying these characteristics and heat resistance. In consequence, a width of selection of material of the light receiving layer is narrowed.

As described above, as the technique for enhancing the heat resistance of the light receiving layer, many techniques for improving the light receiving layer itself are proposed. However, any technique for enhancing the heat resistance while paying attention to constituent elements other than the light receiving layer has not been known yet.

Incidentally, even in not only the solid-state imaging element but other devices such as solar cells using a light receiving layer, so far as those prepared through the heating step after the formation of a light receiving layer are concerned, such a problem regarding the heat resistance is similarly generated.

JP-A-2005-085933, JP-A-2008-072435, and JP-A-2008-072589 describe a manufacturing method of a photoelectric conversion element in which ITO is film-formed on a glass substrate by means of sputtering and then subjected to patterning to form pixel electrodes, the substrate is heat dried at 250° C., and thereafter, a light receiving layer and a counter electrode are formed.

However, in this manufacturing method, only heating is performed at 250° C. for drying the ITO pixel electrodes, but an enhancement of the heat resistance is not aimed. Also, a specific configuration for enhancing the heat resistance is not described.

Also, JP-A-2009-071057 and JP-A-11-326038 describe that pixel electrodes are formed by a CVD method. However, these patent documents do not describe a specific configuration for enhancing the heat resistance.

Also, JP-A-2001-007367 describes a manufacturing method in which pixel electrodes are formed and then heated at 230° C. or higher. However, this patent document does not describe a specific configuration for enhancing the heat resistance.

In view of the foregoing circumstances, the invention has been made, and an object thereof is to provide a photoelectric conversion element including an organic material-containing light receiving layer, which is able to enhance heat resistance regardless of the material of the light receiving layer. Also, another object of the invention is to provide a solid-state imaging element equipped with this photoelectric conversion element, an imaging apparatus equipped with this solid-state imaging element and a method for manufacturing this photoelectric conversion element.

SUMMARY OF INVENTION

[1] According to an aspect of the invention, a photoelectric conversion element includes an insulating film, a first electrode, a light receiving layer, and a second electrode. The insulating film is formed on a substrate and is made of an oxide film. The first electrode is formed on the insulating film. The light receiving layer is formed on the first electrode and includes an organic material. The second electrode is formed on the light receiving layer. The first electrode is made of titanium oxynitride. A composition of the first electrode just before forming the light receiving layer meets (1) a requirement that an amount of oxygen contained in the whole of the first electrode is 75 atm % or more of an amount of titanium, or (2) a requirement that in a range of from the substrate side of the first electrode to 10 nm or a range of from the substrate side of the first electrode to ⅔ of the thickness of the first electrode, an amount of oxygen is 40 atm % or more of an amount of titanium.

[2] In the photoelectric conversion element of [1], a composition of the first electrode just before forming the light receiving layer further meets (3) a requirement that an amount of nitrogen contained in the whole of the first electrodes is 73 atm % or less of an amount of titanium, or (4) a requirement that in a range of from the substrate side of the first electrode to 10 nm or a range of from the substrate side of the first electrode to ⅔ of the thickness of the first electrode, an amount of nitrogen is 90 atm % or less of an amount of titanium.

[3] According to another aspect of the invention, a photoelectric conversion element includes an insulating film, a first electrode, a light receiving layer, and a second electrode. The insulating film is formed on a substrate and is made of an oxide film. The first electrode is formed on the insulating film. The light receiving layer is formed on the first electrode and includes an organic material. The second electrode is formed on the light receiving layer. The first electrode is made of titanium oxynitride. A composition of the first electrode just before forming the light receiving layer meets (1) a requirement that an amount of nitrogen contained in the whole of the first electrodes is 73 atm % or less of an amount of titanium, or (2) a requirement that in a range of from the substrate side of the first electrode to 10 nm or a range of from the substrate side of the first electrode to ⅔ of the thickness of the first electrode, an amount of nitrogen is 90 atm % or less of an amount of titanium.

[4] In the photoelectric conversion element of any one of [1] to [3], a plurality of the first electrodes are arranged and formed on the insulating film, and the light receiving layer is formed to cover the plural first electrodes.

[5] In the photoelectric conversion element of any one of [1] to [4], the light receiving layer includes an organic material-containing charge blocking layer and an organic material-containing photoelectric conversion layer.

[6] According to another aspect of the invention, a solid-state imaging element includes the photoelectric conversion element according to any one of [1] to [4] and a signal read-out circuit formed on the substrate, which reads out a signal in response to a charge amount of charge generated within the light receiving layer and collected by the first electrode.

[7] According to another aspect of the invention, an imaging apparatus includes the solid-state imaging element of [6].

[8] According to another aspect of the invention, a method for manufacturing a photoelectric conversion element including a substrate having thereon an insulating film made of an oxide film, a first electrode formed on the insulating film, a light receiving layer formed on the first electrode and including an organic material, and a second electrode formed on the light receiving layer, includes first to third forming step. In the first forming step, the first electrode is formed on the insulating film. In the second forming step, the light receiving layer is formed on the first electrode. In the third forming step, the second electrode is formed on the light receiving layer. In the forming step of the first electrode, the first electrode is formed so as to meet (1) a requirement that an amount of oxygen contained in the whole of the first electrode is 75 atm % or more of an amount of titanium, or (2) a requirement that in a range of from the substrate side of the first electrode to 10 nm or a range of from the substrate side of the first electrode to ⅔ of the thickness of the first electrode, an amount of oxygen is 40 atm % or more of an amount of titanium.

[9] In the method for manufacturing a photoelectric conversion element of [8], in the forming step of the first electrode, the first electrode is formed so as to further meet (3) a requirement that an amount of nitrogen contained in the whole of the first electrodes is 73 atm % or less of an amount of titanium, or (4) a requirement that in a range of from the substrate side of the first electrode to 10 nm or a range of from the substrate side of the first electrode to ⅔ of the thickness of the first electrode, an amount of nitrogen is 90 atm % or less of an amount of titanium.

[10] According to another aspect of the invention, a method for manufacturing a photoelectric conversion element including a substrate having thereon an insulating film made of an oxide film, a first electrode formed on the insulating film, a light receiving layer formed on the first electrode and including an organic material, and a second electrode formed on the light receiving layer, includes first to third forming step. In the first forming step, the first electrode is formed on the insulating film. In the second forming step, the light receiving layer is formed on the first electrode. In the third forming step, the second electrode is formed on the light receiving layer. In the forming step of the first electrode, the first electrode is formed so as to meet (1) a requirement that an amount of nitrogen contained in the whole of the first electrodes is 75 atm % or less of an amount of titanium, or (2) a requirement that in a range of from the substrate side of the first electrode to 10 nm or a range of from the substrate side of the first electrode to ⅔ of the thickness of the first electrode, an amount of nitrogen is 90 atm % or less of an amount of titanium.

[11] In the method for manufacturing a photoelectric conversion element according to any one of [8] to [10], in the forming seep of the first electrode, a plurality of the first electrodes are arranged and formed on the insulating film, and in the forming step of the light receiving layer, the light receiving layer is formed to cover the plural first electrodes.

[12] In the method for manufacturing a photoelectric conversion element of [11], the first forming step of the first electrode includes a step of film-forming the titanium oxynitride on the insulating film by a sputtering method, a step of patterning a film of the film-formed titanium oxynitride, and a step of after patterning, heating the substrate at 270° C. or higher.

[13] In the method for manufacturing a photoelectric conversion element of [11], the forming step of the first electrode includes a step of film-forming the titanium oxynitride on the insulating film by a CVD (chemical vapor deposition) method and a step of patterning a film of the film-formed titanium oxynitride.

According to the invention, it is possible to provide a photoelectric conversion element including an organic material-containing light receiving layer, which is able to enhance heat resistance regardless of the material of the light receiving layer. Also, it is possible to provide a solid-state imaging element equipped with this photoelectric conversion element, an imaging apparatus equipped with this solid-state imaging element and a method for manufacturing this photoelectric conversion element.

DETAILED DESCRIPTION

Figure 1:
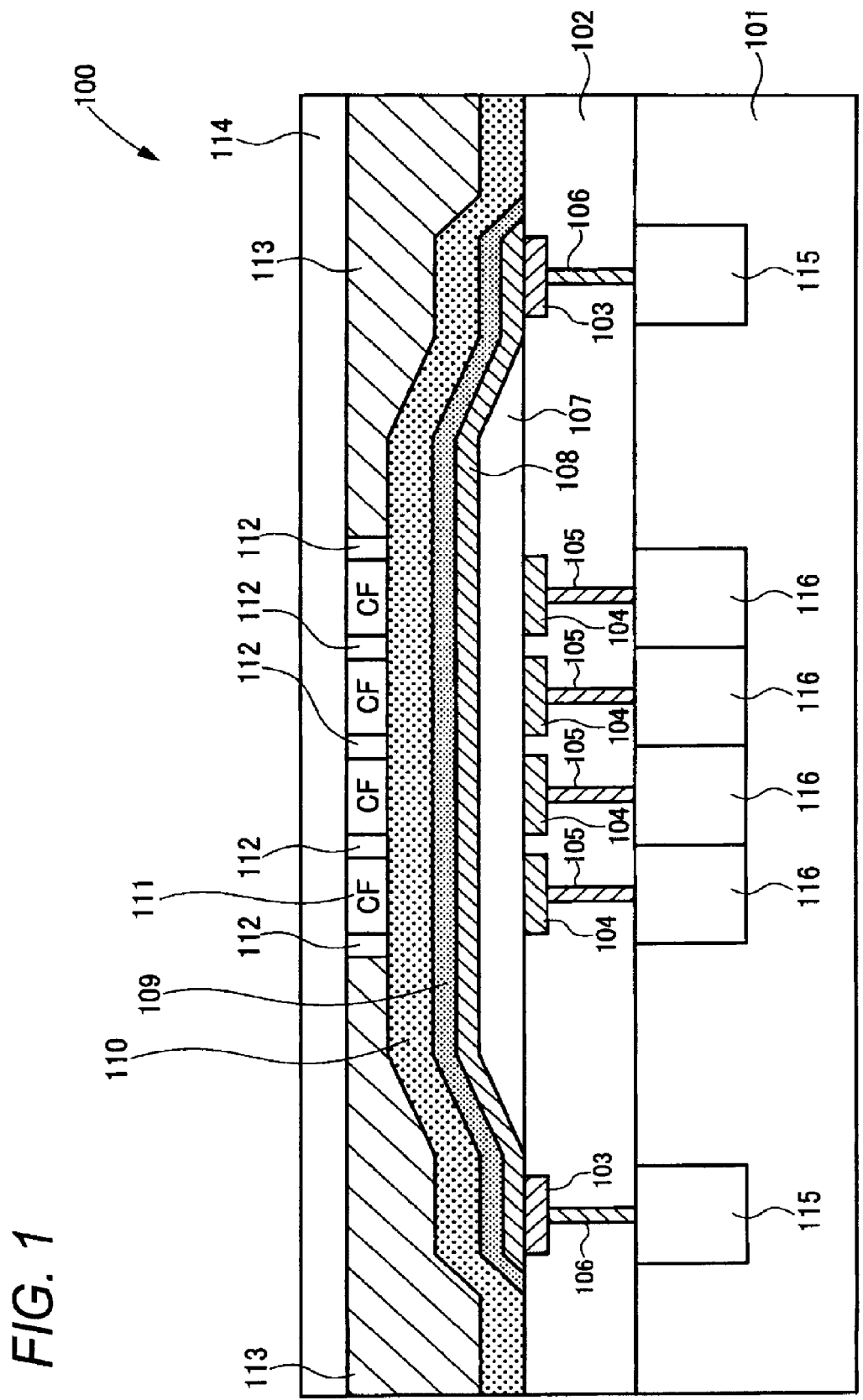
FIG. 1 is a sectional schematic view showing a diagrammatic configuration of a solid-state imaging element for explaining one embodiment of the invention.

Embodiments of the invention are hereunder described by reference to the accompanying drawings.

In a photoelectric conversion element in which an insulating film constituted of an oxide film is formed on a substrate and which includes pixel electrodes formed on the insulating film, an organic material-containing light receiving layer formed on the pixel electrodes and a counter electrode formed on the light receiving layer, the present inventors made investigation on how to enhance the heat resistance. As a result, it has been found that in the case where each of the pixel electrodes is constituted of titanium oxynitride (TiON), even when the same light receiving layer is used, the heat resistance of the photoelectric conversion element is different depending upon a ratio of at least one of oxygen and nitrogen to titanium in the pixel electrode.

Specifically, when a composition of the pixel electrode just before forming the light receiving layer meets (1) a requirement that an amount of oxygen contained in the whole of pixel electrodes is 75 atm % or more (preferably 85 atm % or more, and more preferably 100 atm % or more) of an amount of titanium, or (2) a requirement that in a range of from the substrate side of the pixel electrode to 10 nm or a range of from the substrate side of the pixel electrode to ⅔ of the whole thickness, an amount of oxygen is 40 atm % or more (preferably 60 atm % or more, and more preferably 70 atm % or more) of an amount of titanium, the heat resistance of the light receiving layer to be formed thereon is enhanced. When an oxygen ratio within the pixel electrode is excessively high, electric conductivity is lowered, and hence, it is preferable that the amount of oxygen is 150 atm % or less relative to the amount of titanium in all of the requirements (1) and (2).

Alternatively, when a composition of the pixel electrode just before forming the light receiving layer meets (3) a requirement that an amount of nitrogen contained in the whole of pixel electrodes is 73 atm % or less (preferably 65 atm % or less, and more preferably 50 atm % or less) of an amount of titanium, or (4) a requirement that in a range of from the substrate side of the pixel electrode to 10 nm or a range of from the substrate side of the pixel electrode to ⅔ of the whole thickness, an amount of nitrogen is 90 atm % or less (preferably 80 atm % or less, and more preferably 50 atm % or less) of an amount of titanium, the heat resistance of the light receiving layer to be formed thereon is enhanced.

Although the reasons why the heat resistance is enhanced by the present prescriptions are not elucidated yet, it may be considered that when a light receiving layer is formed relative to a substrate in which TiON having different conditions from those described above is formed, change of the state of the pixel electrode, for example, one acting on the light receiving layer, is caused in a heating step to be performed later on the photoelectric conversion element, whereby the performance is deteriorated due to that action.

Incidentally, the heating step to be performed later on the photoelectric conversion element, as referred to herein, means a high-temperature heating treatment which is performed in, for example, curing of a color filter, wire bonding, die bonding, solder reflow, formation of a PAD opening, or the like (in general, a heating treatment at 200° C. or higher), which are performed after the formation of a counter electrode.

It may be considered that by the heating step to be performed later on the photoelectric conversion element, oxygen is incorporated into the pixel electrodes from an oxide film (for example, an SiO2 film) existing beneath the pixel electrodes, and as a result, for example, a very small amount of a gas spouts to act on the light receiving layer, thereby possibly producing a process of deteriorating the performance.

Although the kind of a volatilized gas is not certain, in view of the facts that deterioration of the performance of the light receiving layer is inhibited by controlling an amount of nitrogen in the pixel electrodes to a fixed amount or less; and that a ratio of nitrogen to titanium decreases after heating the pixel electrodes as compared with that before heating, it may be assumed that a nitrogen-containing gas volatilizes. For that reason, it may be considered that it is preferable to control the amount of nitrogen in the pixel electrodes to a fixed amount or less. In consequence, it may be considered that it is effective to meet the foregoing requirement (3).

Also, it may be considered that volatilization of a nitrogen-containing gas component following at the time of the heating step to be performed later on the photoelectric conversion element is caused due to incorporation of oxygen from the oxide film on the substrate surface. For that reason, there may be taken an embodiment in which the ratio of nitrogen is small in not only the whole of pixel electrodes but the neighborhood of the substrate surface. In consequence, it may be considered that it is also effective to meet the foregoing requirement (4) in place of the foregoing requirement (3).

Also, it may be considered that volatilization of a nitrogen-containing gas component following at the time of the heating step to be performed later on the photoelectric conversion element is caused due to incorporation of oxygen from the oxide film on the substrate surface. For that reason, in order that a large quantity of oxygen may not penetrate into the pixel electrodes after the heating step, it may be considered to be effective that a composition of the pixel electrode just before forming the light receiving layer meets the foregoing requirement (1).

Also, since there may be the case where the penetration of oxygen is caused due to incorporation of oxygen into the pixel electrodes from the oxide film of the substrate surface, there may be taken an embodiment in which the ratio of oxygen is large in not only the whole of pixel electrodes but the neighborhood of the substrate surface. In consequence, it may also be considered to be effective to meet the foregoing requirement (2) in place of the foregoing requirement (1).

For enhancing the heat resistance, it is preferable to meet both the foregoing requirement (1) or (2) and the foregoing requirement (3) or (4) because it may be considered that the incorporation of oxygen and the volatilization of a gas is effectively prevented from occurring.

As a method of allowing at least one of the foregoing requirements (1) to (4) to be met, the following method is exemplified.

First of all, an oxide film (for example, silicon oxide) is formed on a substrate such as silicon and glass; thereafter, titanium oxynitride is film-formed thereon by means of sputtering; and this titanium oxynitride is subjected to patterning by means of photolithography and etching, thereby forming plural pixel electrodes. Subsequently, the plural pixel electrodes are heated, and thereafter, a light receiving layer and a counter electrode are successively formed on the plural pixel electrodes, thereby accomplishing a photoelectric conversion element.

In heating the plural pixel electrodes, when heating is performed at a temperature higher than a heating temperature in a step where the heating temperature is highest in the heating step of heating the substrate to be performed on the photoelectric conversion element after forming the counter electrode (preferably a temperature of at least 50° C. higher than the subject heating temperature, and more preferably a temperature of at least 100° C. higher than the subject heating temperature), at least one of the foregoing requirements (1) to (4) can be met. Incidentally, a temperature in heating the plural pixel electrodes is preferably 270° C. or higher. When the temperature exceeds 800° C., in case where oxygen exist in the environment of the heating step, oxygen react with the pixel electrode and the pixel electrode becomes an insulator, and hence, the temperature in heating the plural pixel electrodes is preferably not higher than 800° C.

In this way, it may be considered that when heating is performed at a temperature higher than the heating temperature in the subsequent heating step after forming the pixel electrodes and before forming the light receiving layer (a temperature to an extent that the composition of the pixel electrode does not substantially change in the subsequent heating step), a sufficient amount of oxygen is incorporated into the pixel electrodes, and nitrogen thoroughly volatilizes. As a result, at least one of the requirements (1) to (4) under which the heat resistance can be enhanced can be met.

When at least one the requirements (1) to (4) is met, even in the case of performing the heating step after forming the counter electrode, incorporation of oxygen into the pixel electrodes does not occur so much; volatilization of nitrogen does not generate so much; and change of the state of the pixel electrode, for example, one acting on the light receiving layer, is not caused, whereby the heat resistance is enhanced.

As another method of allowing at least one of the foregoing requirements (1) to (4) to be met, the following method is exemplified.

An oxide film (for example, silicon oxide) is formed on a substrate such as silicon and glass; thereafter, titanium oxynitride is film-formed thereon by means of a CVD method; and this titanium oxynitride is subjected to patterning by means of photolithography and etching, thereby forming plural pixel electrodes. Subsequently, a light receiving layer and a counter electrode are successively formed on the plural pixel electrodes, thereby accomplishing a photoelectric conversion element. According to this method, at least one of the requirements (1) to (4) is met without performing heating after forming the pixel electrodes.

Incidentally, the foregoing explanation is made on a premise that plural pixel electrodes are formed. However, even in a photoelectric conversion element including a single pixel electrode, a light receiving layer disposed on the pixel electrode and a counter electrode disposed on the light receiving layer, by heating the pixel electrode or forming the pixel electrode by means a CVD method as described above, at least one of the requirements (1) to (4) can be met.

An embodiment of a solid-stage imaging element using a photoelectric conversion element including an organic material-containing light receiving layer is hereunder described.

FIG. 1 is a sectional schematic view showing a diagrammatic configuration of a solid-state imaging element for explaining one embodiment of the invention. This solid-state imaging element is used upon being mounted on an imaging apparatus such as a digital camera, a digital video camera, an electronic endoscope apparatus, and a camera-equipped mobile phone.

A solid-state imaging element 100 shown in FIG. 1 is equipped with a substrate 101, an insulating layer 102, a connection electrode 103, a pixel electrode 104, a connection part 105, a connection part 106, a light receiving layer 107, a counter electrode 108, a buffer layer 109, a sealing layer 110, a color filter 111, a partition wall 112, a light shielding layer 113, a protective layer 114, a counter electrode voltage supply part 115, and a read-out circuit 116.

The substrate 101 is a glass substrate or a semiconductor substrate made of silicon or the like. The insulating layer 102 made of silicon oxide is formed on the substrate 101. A plurality of the pixel electrodes 104 are arranged and formed on the surface of the insulating layer 102, and the connection electrodes 103 are formed corresponding to the pixel electrodes 104 within the insulating layer 102.

The light receiving layer 107 is an organic material-containing layer and is configured to include at least a photoelectric conversion layer. The photoelectric conversion layer is one for generating a charge in response to the received light. The light receiving layer 107 is provided on the plural pixel electrodes 104 to cover the plural pixel electrodes 104. Although the light receiving layer 107 has a fixed film thickness on the pixel electrodes 104, there is no problem even when the film thickness of the light receiving layer 107 changes in parts other than the pixel part (outside an effective pixel region). Details of the light receiving layer 107 are described later. Incidentally, the light receiving layer 107 includes not only one configured of a layer which is composed only of an organic material but a configuration in which a part of layers contains an inorganic material.

The counter electrode 108 is an electrode counter to the pixel electrodes 104 and is provided on the light receiving layer 107 to cover the light receiving layer 107. The counter electrode 108 is formed extending over the connection electrodes 103 disposed outside the light receiving layer 107 and electrically connected to the connection electrodes 103.

For the purpose of making light incident into the light receiving layer 107 including a photoelectric conversion layer, the counter electrode 108 is preferably constituted of a transparent electrically conductive film, and examples of a material constituting the counter electrode 108 include metals, metal oxides, metal nitrides, metal borides, organic electrically conductive compounds, and mixtures thereof.

Specific examples thereof include electrically conductive metal oxides such as tin oxide, zinc oxide, indium oxide, indium tin oxide (ITO), indium zinc oxide (IZO), indium tungsten oxide (IWO), and titanium oxide; metal nitrides such as TiN; metals such as gold (Au), platinum (Pt), silver (Ag), chromium (Cr), nickel (Ni), and aluminum (Al); mixtures or stacks of such metal and electrically conductive metal oxide; organic electrically conductive compounds such as polyaniline, polythiophene, and polypyrrole; and stacks of such an organic electrically conductive compound and ITO.

Any one of materials of ITO, IZO, tin oxide, antimony-doped tin oxide (ATO), fluorine-doped tin oxide (FTO), zinc oxide, antimony-doped zinc oxide (AZO), and gallium-doped zinc oxide (GZO) is especially preferable as the material of the transparent electrically conductive film.

The connection part 106 is embedded in the insulating layer 102 and is a plug for electrically connecting the connection electrode 103 and the counter electrode voltage supply part 115 to each other, or the like.

The counter electrode voltage supply part 115 is formed in the substrate 101 and impresses a prescribed voltage to the counter electrode 108 via the connection part 106 and the connection electrode 103.

In the case where a voltage to be impressed to the counter electrode 108 is higher than a power supply voltage of the solid-state imaging element 100, the foregoing prescribed voltage is supplied by boosting the power supply voltage by a charge pump boosting circuit or the like.

The pixel electrode 104 is a charge collecting electrode for collecting a charge generated within the light receiving layer 107 existing between the pixel electrode 104 and the counter electrode 108 counter to the pixel electrode 104.

The pixel electrode 104 is constituted of titanium oxynitride (TiON). A composition of the pixel electrode 104 just before forming the light receiving layer 107 meets any one of the foregoing requirements (1) to (4) or both of the foregoing requirement (1) or (2) and the foregoing requirement (3) or (4).

The read-out circuit 116 is provided in the substrate 101 corresponding to each of the plural pixel electrodes 104 and reads out a signal in response to a charge collected by the corresponding pixel electrode 104.

The read-out circuit 116 is configured of, for example, CCD, an MOS circuit, a TFT circuit, or the like and shielded from light by a non-illustrated light shielding layer disposed within the insulting layer 102.

The buffer layer 109 is formed on the counter electrode 108 to cover the counter electrode 108.

The sealing layer 110 is formed on the buffer layer 109 to cover the butter layer 109.

The color filter 111 is formed on the sealing layer 110 at a position counter to each of the pixel electrodes 104.

The partition wall 112 is provided between the color filters 111 each other and is one for enhancing light transmission efficiency of the color filter 111.

The light shielding layer 113 is formed on the sealing layer 110 in other regions than those in which the color filters 111 and the partition walls 112 are provided and prevents light from incidence into the light receiving layer 107 formed in other region than the effective pixel region.

The protective layer 114 is formed on the color filters 111, the partition walls 112 and the light shielding layers 113 and protects the whole of the solid-state imaging element 100.

Incidentally, in the example of FIG. 1, although the mode in which the pixel electrodes 104 and the connection electrodes 103 are embedded in the surface part of the insulating layer 102 is taken, a mode in which these electrodes 104 and connection electrodes 103 are formed on the insulating layer 102 may also be taken.

Also, a plural number of a set of the connection electrode 103, the connection part 106 and the counter electrode voltage supply part 115 is provided. However, only one set may also be provided. As seen in the example of FIG. 1, by supplying a voltage to the counter electrode 108 from the both ends of the counter electrode 108, a voltage drop in the counter electrode 108 can be inhibited. The number of this set may be properly increased or decreased taking into consideration a chip area of the element.

A preferred configuration of the light receiving layer 107 is hereunder described.

Figure 2:
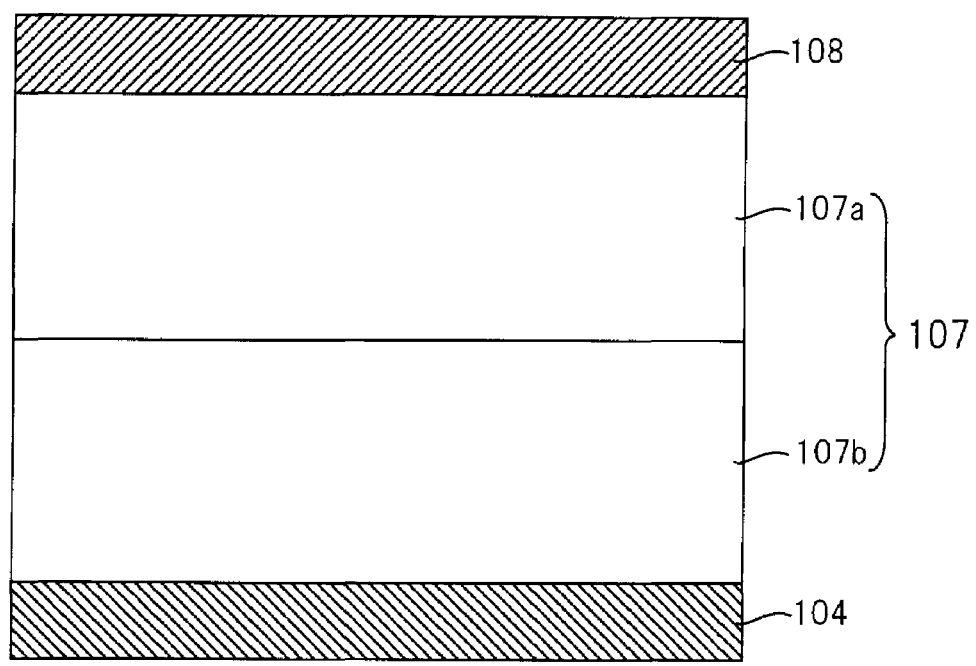
FIG. 2 is a sectional schematic view showing a preferred example of a light receiving layer in the solid-state imaging element shown in FIG. 1.

FIG. 2 is a section showing an example of the configuration of the light receiving layer 107. As shown in FIG. 2, the light receiving layer 107 includes a charge blocking layer 107b provided on the side of the pixel electrode 104 and a photoelectric conversion layer 107a provided on the charge blocking layer 107b. A positional relation between the charge blocking layer 107b and the photoelectric conversion layer 107a may be reversed.

The charge blocking layer 107b has a function to inhibit a dark current. The charge blocking layer may be configured of plural layers. By configuring the charge blocking layer 107b of plural layers, an interface between the plural charge blocking layers is formed, and discontinuity is generated in an intermediate level existing in each of the layers, whereby a charge carrier hardly transfers via the intermediate level, and a dark current can be strongly inhibited.

The photoelectric conversion layer 107a includes a p-type organic semiconductor and an n-type organic semiconductor. By joining the p-type organic semiconductor and the n-type organic semiconductor to form a donor/acceptor interface, exciton dissociation efficiency can be increased. For that reason, the photoelectric conversion layer 107a having a configuration in which the p-type organic semiconductor and the n-type organic semiconductor are joined reveals high photoelectric conversion efficiency. In particular, the photoelectric conversion layer 107a in which the p-type organic semiconductor and the n-type organic semiconductor are mixed is preferable because a joined interface increases, whereby the photoelectric conversion efficiency is enhanced.

The p-type organic semiconductor (compound) is an organic semiconductor with donor properties and means an organic compound which is represented chiefly by hole transporting organic compounds and which has properties of easily donating an electron. In more detail, the p-type organic semiconductor refers to an organic compound having a smaller ionization potential when two organic materials are brought into contact with each other. In consequence, as for the organic compound with donor properties, any organic compound can be used so far as it is an organic compound having electron donating properties. Examples of the compound which can be used include triarylamine compounds, benzidine compounds, pyrazoline compounds, styrylamine compounds, hydrazone compounds, triphenylmethane compounds, carbazole compounds, polysilane compounds, thiophene compounds, phthalocyanine compounds, cyanine compounds, merocyanine compounds, oxonol compounds, polyamine compounds, indole compounds, pyrrole compounds, pyrazole compounds, polyarylene compounds, condensed aromatic carbocyclic compounds (for example, naphthalene derivatives, anthracene derivatives, phenanthrene derivatives, tetracene derivatives, pyrene derivatives, perylene derivatives, fluoranthene derivatives, etc.), and metal complexes having a nitrogen-containing heterocyclic compound as a ligand. Incidentally, the compound is not limited to those described above, and an organic compound may be used as the organic semiconductor with donor properties so far as it has an ionization potential smaller than that of an organic compound used as the n-type (with acceptor properties) compound.

The n-type organic semiconductor (compound) is an organic semiconductor with acceptor properties and means an organic compound which is represented chiefly by electron transporting organic compounds and which has properties of easily accepting an electron. In more detail, the n-type organic semiconductor refers to an organic compound having a larger electron affinity when two organic materials are brought into contact with each other. In consequence, as for the organic compound with acceptor properties, any organic compound can be used so far as it is an organic compound having electron accepting properties. Examples of the compound which can be used include condensed aromatic carbocyclic compounds (for example, naphthalene derivatives, anthracene derivatives, phenanthrene derivatives, tetracene derivatives, pyrene derivatives, perylene derivatives, fluoranthene derivatives, etc.), 5-membered to 7-membered heterocyclic compounds containing a nitrogen atom, an oxygen atom or a sulfur atom (for example, pyridine, pyrazine, pyrimidine, pyridazine, triazine, quinoline, quinoxaline, quinazoline, phthalazine, cinnoline, isoquinoline, pteridine, acridine, phenazine, phenanthroline, tetrazole, pyrazole, imidazole, thiazole, oxazole, indazole, benzimidazole, benzotriazole, benzoxazole, benzothiazole, carbazole, purine, triazolopyridazine, triazolopyrimidine, tetrazaindene, oxadiazole, imidazopyridiene, pyrazine, pyrrolopyridine, thiadiazolopyridine, dibenzazepine, tribenzazepine, etc.), polyarylene compounds, fluorenone compounds, cyclopentadiene compounds, silyl compounds, and metal complexes having a nitrogen-containing heterocyclic compound as a ligand. Incidentally, the compound is not limited to those described above, and an organic compound may be used as the organic semiconductor with acceptor properties so far as it has an electron affinity larger than that of an organic compound used as the p-type (with donor properties) compound.

As the p-type organic semiconductor or n-type organic semiconductor, any organic dye may be used. Preferred examples thereof include cyanine dyes, styryl dyes, hemicyanine dyes, merocyanine dyes (including zero-methine merocyanine (simple merocyanine)), trinuclear merocyanine dyes, tetranuclear merocyanine dyes, rhodacyanine dyes, complex cyanine dyes, complex merocyanine dyes, allopolar dyes, oxonol dyes, hemioxonol dyes, squarium dyes, croconium dyes, azamethine dyes, coumarin dyes, allylidene dyes, anthraquinone dyes, triphenylmethane dyes, azo dyes, azomethine dyes, spiro compounds, metallocene dyes, fluorenone dyes, fulgide dyes, perylene dyes, perinone dyes, phenazine dyes, phenothiazine dyes, quinone dyes, diphenylmethane dyes, polyene dyes, acridine dyes, acridinone dyes, diphenylamine dyes, quinacridone dyes, quinophthalone dyes, phenoxazine dyes, phthaloperylene dyes, diketopyrropyrrole dyes, dioxane dyes, porphyrin dyes, chlorophyll dyes, phthalocyanine dyes, metal complex dyes, and condensed aromatic carbocyclic dyes (for example, naphthalene derivatives, anthracene derivatives, phenanthrene derivatives, tetracene derivatives, pyrene derivatives, perylene derivatives, fluoranthene derivatives, etc.).

It is especially preferable to use, as the n-type organic semiconductor, a fullerene or a fullerene derivative having excellent electron transport properties. The fullerene as referred to herein expresses fullerene C60, fullerene C70, fullerene C76, fullerene C78, fullerene C80, fullerene C82, fullerene C84, fullerene C90, fullerene C96, fullerene C240, fullerene C540, a mixed fullerene, or a fullerene nanotube; and the fullerene derivative as referred to herein expresses a compound in which a substituent is added such a fullerene.

When the photoelectric conversion layer 107a contains a fullerene or a fullerene derivative, an electron generated due to photoelectric conversion can be fast transported into the pixel electrode 104 or the counter electrode 108 via a fullerene molecule or a fullerene derivative molecule. When a path of electrons is formed in a state where fullerene molecules or fullerene derivative molecules are in a line, the electron transport properties are enhanced, thereby enabling one to realize high-speed responsibility of the photoelectric conversion element. In order to achieve this, it is preferable that the fullerene or the fullerene derivative is contained in a content of 40% or more in the photoelectric conversion layer 107a. Indeed, the content of the fullerene or the fullerene derivative is excessively high, the content of the p-type organic semiconductor decreases, and the joined interface becomes small, so that the exciton dissociation efficiency is lowered.

Use of a triarylamine compound described in Japanese Patent No. 4213832 or the like as the p-type organic semiconductor which is mixed together with the fullerene or the fullerene derivative in the photoelectric conversion layer 107a is especially preferable because it becomes possible to reveal a high SN ratio of the photoelectric conversion element. When the ratio of the fullerene or the fullerene derivative in the photoelectric conversion layer 107a is excessively large, the content of the triarylamine compound becomes small, so that the absorption amount of incident light is lowered. According to this, the photoelectric conversion efficiency decreases. Therefore, a composition in which the content of the fullerene or the fullerene derivative to be contained in the photoelectric conversion layer 107a is not more than 85% is preferable.

It is preferable to use a compound represented by the following general formula (1) as the p-type organic semiconductor which is used in the photoelectric conversion layer 107a.

formula (1)

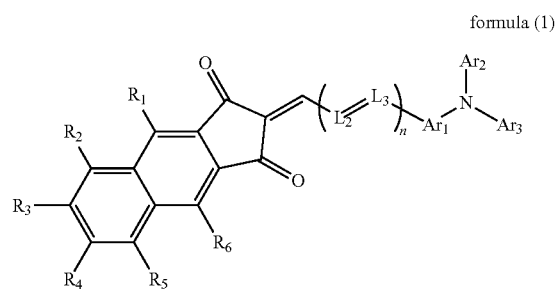

In the formula, each of L2 and L3 represents a methine group. n represents an integer of from 0 to 2. Ar1 represents a divalent substituted arylene group or unsubstituted arylene group. Each of Ar2 and Ar3 independently represents a substituted aryl group, an unsubstituted aryl group, a substituted alkyl group, an unsubstituted alkyl group, a substituted heteroaryl group, or an unsubstituted heteroaryl group. Also, each of R1 to R6 independently represents a hydrogen atom, a substituted alkyl group, an unsubstituted alkyl group, a substituted aryl group, an unsubstituted aryl group, a substituted heteroaryl group, or an unsubstituted heteroaryl group, and adjoining groups may be bonded to each other to form a ring.

The arylene group represented by Ar1 is preferably an arylene group having from 6 to 30 carbon atoms, and more preferably an arylene group having from 6 to 18 carbon atoms. The arylene group may have a substituent and is preferably an arylene having from 6 to 18 carbon atoms which may have an alkyl group having from 1 to 4 carbon atoms. Examples of the arylene group represented by Ar1 include a phenylene group, a naphthylene group, a methylphenylene group, and a dimethylphenylene group. Of these, a phenylene group or a naphthylene group is preferable, with a phenylene group being more preferable.

Each of the aryl groups represented by Ar2 and Ar3 is independently preferably an aryl group having from 6 to 30 carbon atoms, and more preferably an aryl group having from 6 to 18 carbon atoms. The aryl group may have a substituent and is preferably an aryl group having from 6 to 18 carbon atoms which may have an alkyl group having from 1 to 4 carbon atoms or an aryl group having from 6 to 18 carbon atoms. Examples of each of the aryl groups represented by Ar2 and Ar3 include a phenyl group, a naphthyl group, a tolyl group, an anthryl group, a dimethylphenyl group, and a biphenyl group. Of these, a phenyl group or a naphthyl group is preferable, with a phenyl group being more preferable. n is preferably 0 or 1.

The alkyl group represented by each of Ar2 and Ar3 is preferably an alkyl group having from 1 to 6 carbon atoms, and more preferably an alkyl group having from 1 to 4 carbon atoms. Examples of the alkyl groups represented by each of Ar2 and Ar3 include a methyl group, an ethyl group, an n-propyl group, an isopropyl group, an n-butyl group, an isobutyl group, and a t-butyl group. Of these, a methyl group or an ethyl group is preferable, with a methyl group being more preferable.

Each of the heteroaryl groups represented by Ar2 and Ar3 is independently preferably a heteroaryl group having from 3 to 30 carbon atoms, and more preferably a heteroaryl group having from 3 to 18 carbon atoms. The heteroaryl group may have a substituent and is preferably a heteroaryl group having from 3 to 18 carbon atoms which may have an alkyl group having from 1 to 4 carbon atoms or an aryl group having from 6 to 18 carbon atoms. Also, the heteroaryl group represented by each of Ar2 and Ar3 may be a condensed ring structure. The condensed ring structure is preferably one composed of a combination of rings (the rings may be the same as each other) selected among a furan ring, a thiophene ring, a selenophene ring, silole ring, a pyridine ring, a pyrazine ring, a pyrimidine ring, an oxazole ring, a thiazole ring, a triazole ring, an oxadiazole ring, and a thiadiazole ring. Of these, a quinoline ring, an isoquinoline ring, a benzothiophene ring, a dibenzothiophene ring, a thienothiophene ring, a bithienobenzene ring, a bithienothiophene ring is preferable.

The alkyl group represented by each of R1 to R6 is preferably an alkyl group having from 1 to 6 carbon atoms, and more preferably an alkyl group having from 1 to 4 carbon atoms. Examples of the alkyl group represented by each of R1 to R6 include a methyl group, an ethyl group, an n-propyl group, an isopropyl group, an n-butyl group, an isobutyl group, and a t-butyl group. Each of R1 to R6 is preferably a methyl group or an ethyl group, and more preferably a methyl group.

n is preferably o or 1.

Each of the heteroaryl groups represented by R1 to R6 is independently preferably a heteroaryl group having from 3 to 30 carbon atoms, and more preferably a heteroaryl group having from 3 to 18 carbon atoms. The heteroaryl group may have a substituent and is preferably a heteroaryl group having from 3 to 18 carbon atoms which may have an alkyl group having from 1 to 4 carbon atoms or an aryl group having from 6 to 18 carbon atoms. Also, the heteroaryl group represented by each of R1 to R6 is preferably a heteroaryl group composed of a 5-membered, 6-membered or 7-membered ring or a condensed ring thereof. Examples of the hetero atom which is contained in the heteroaryl group include an oxygen atom, a sulfur atom, and a nitrogen atom. Specific examples of the ring constituting the heteroaryl group include a furan ring, a thiophene ring, a pyrrole ring, a pyrroline ring, a pyrrolidine group, an oxazole ring, an isoxazole ring, a thiazole ring, an isothiazole ring, an imidazole ring, an imidazoline ring, an imidazolidine ring, a pyrazole ring, a pyrazoline ring, a pyrazolidine group, a triazole ring, a furazane ring, a tetrazole ring, a pyran ring, a thyine ring, a pyridine ring, a piperidine ring, an oxazine ring, a morpholine ring, a thiazine ring, a pyridazine ring, a pyrimidine ring, a pyrazine ring, a piperazine ring, and a triazine ring.

Examples of the condensed ring include a benzofuran ring, an isobenzofuran ring, a benzothiophene ring, an indole ring, an indoline ring, an isoindole ring, a benzoxazole ring, a benzothiazole ring, an indazole ring, a benzoimidazole ring, a quinoline ring, an isoquinoline ring, a cinnoline ring, a phthalazine ring, a quinazoline ring, a quinoxaline ring, a dibenzofuran ring, a carbazole ring, a xanthene ring, an acridine ring, a phenanthridine ring, a phenanthroline ring, a phenazine ring, a phenoxazine ring, a thianthrene ring, a thienothiophene ring, an indolizine ring, a quinolidine ring, a quinuclidine ring, a naphthridine ring, a purine ring, and a pteridine ring.

Each of the aryl groups represented by R1 to R6 is independently preferably an aryl group having from 6 to 30 carbon atoms, and more preferably an aryl group having from 6 to 18 carbon atoms. The aryl group may have a substituent and is preferably an aryl group having from 6 to 18 carbon atoms which may have an alkyl group having from 1 to 4 carbon atoms or an aryl group having from 6 to 18 carbon atoms. Examples of the aryl group represented by each of R1 to R6 include a phenyl group, a naphthyl group, an anthracenyl group, a pyrenyl group, a phenanthrenyl group, a methylphenyl group, a dimethylphenyl group, and a biphenyl group. Of these, a phenyl group, a naphthyl group, or anthracenyl group is preferable.

Adjoining substituents among Ar1, Ar2, Ar3, and R1 to R6 may be connected to each other to form a ring. Preferred examples of the ring which is formed include a cyclohexene ring, a cyclopentene ring, a benzene ring, a naphthalene ring, a thiophene ring, and a pyran ring.

In the case where each of Ar2, Ar3, and R1 to R6 has a substituent, examples of the substituent include a halogen atom, an alkyl group (including a methyl group, an ethyl group, an n-propyl group, an isopropyl group, a t-butyl group, a cycloalkyl group, a bicycloalkyl group, and tricycloalkyl group), an alkenyl group (including a cycloalkenyl group and a bicycloalkenyl group), an alkynyl group, an aryl group, a heterocyclic group (may also be called a hetero ring group), a cyano group, a hydroxyl group, a nitro group, a carboxy group, an alkoxy group, an aryloxy group, a silyloxy group, a heterocyclic oxy group, an acyloxy group, a carbamoyloxy group, an alkoxycarbonyl group, an aryloxycarbonyl group, an amino group (including an aniline group), an ammonio group, an acylamino group, an aminocarbonylamino group, an alkoxycarbonylamino group, an aryloxycarbonylamino group, a sulfamoylamino group, an alkyl- or arylsulfonylamino group, a mercapto group, an alkylthio group, an arylthio group, a heterocyclic thio group, a sulfamoyl group, a sulfo group, an alkyl- or arylsulfinyl group, an alkyl- or arylsulfonyl group, an acyl group, an aryloxycarbonyl group, an alkoxycarbonyl group, a carbamoyl group, an aryl or heterocyclic azo group, an imide group, a phosphino group, a phosphinyl group, a phosphinyloxy group, a phosphinylamino group, a phosphono group, a silyl group, a hydrazino group, a ureido group, a boronic acid group (—B(OH)$_2$), a phosphato group (—OPO(OH)2), a sulfato group (—OSO3H), and other known substituents.

Specific examples of the compound represented by the general formula (1) are hereunder shown, but it should not be construed that the invention is limited thereto.

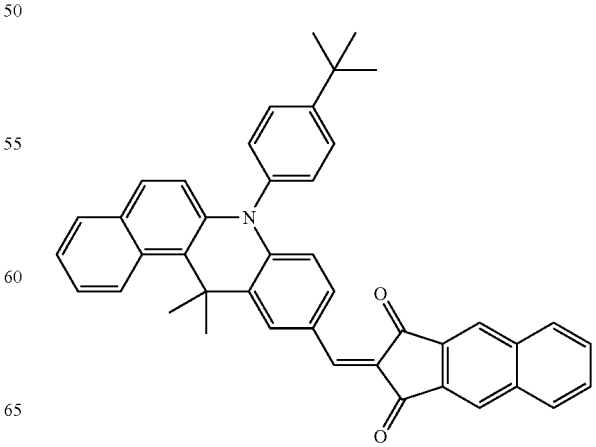

-continued

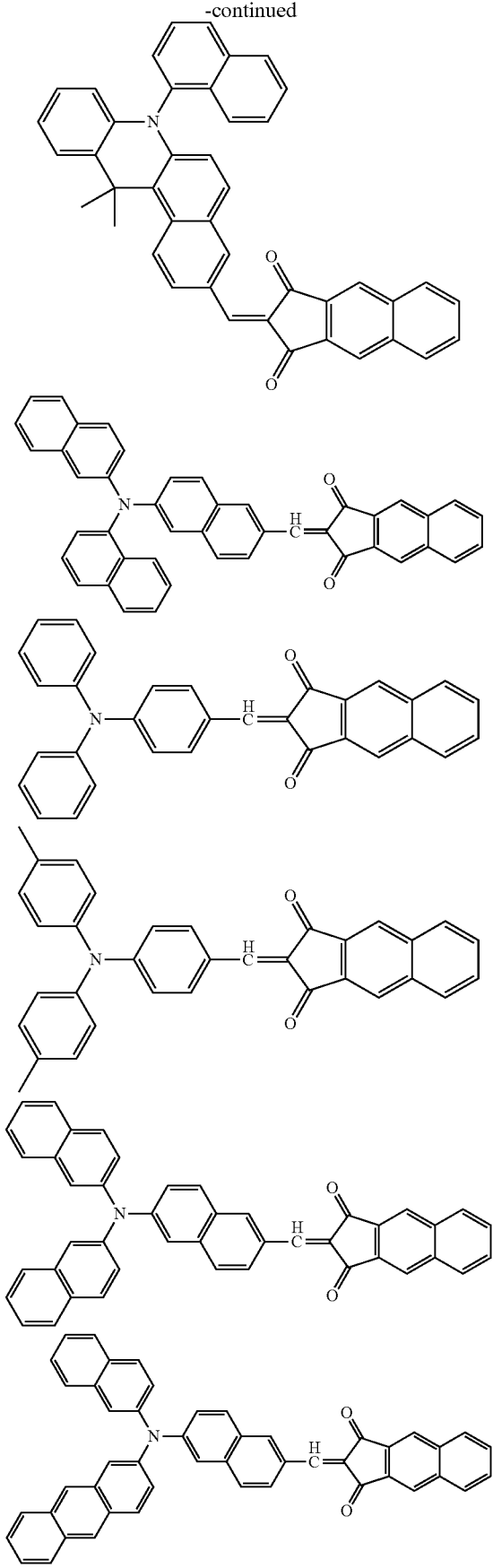

-continued

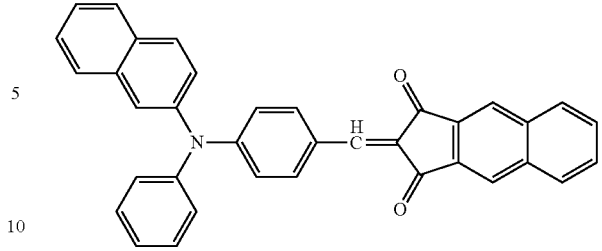

For the charge blocking layer 107b, an electron donating organic material can be used. Specifically, examples of a low molecular weight material which can be used include aromatic diamine compounds such as N,N'-bis(3-methylphenyl)-(1,1'-biphenyl)-4,4'-diamine (TPD) and 4,4'-bis[N-(naphthyl)-N-phenyl-amino]biphenyl (□-NPD), oxazole, oxadiazole, triazole, imidazole, imidazolone, stilbene derivatives, pyrazoline derivatives, tetrahydroimidazole, polyarylalkanes, butadiene, 4,4',4"-tris(N-(3-methylphenyl)N-phenylamino)triphenylamine (m-MTDATA), porphyrin compounds such as porphine, tetraphenylporphine copper, phthalocyanine, copper phthalocyanine, and titanium phthalocyanine oxide, triazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, oxazole derivatives, styrylanthracene derivatives, fluorenone derivatives, hydrazone derivatives, and silazane derivatives. Examples of a polymer material which can be used include polymers of, for example, phenylenevinylene, fluorene, carbazole, indole, pyrene, pyrrole, picoline, thiophene, acetylene, diacetylene or the like, and derivatives of these polymers. It is also possible to use even a compound which is not an electron donating compound but has sufficient hole transporting properties.

It is also possible to use an inorganic material as the charge blocking layer 107b. Since an inorganic material is in general larger in dielectric constant than an organic material, in the case of using an inorganic material in the charge blocking layer 107b, a large voltage is applied to the photoelectric conversion layer 107a, thereby enabling one to enhance the photoelectric conversion efficiency. Examples of a material which can be formed into the charge blocking layer 107b include calcium oxide, chromium oxide, copper chromium oxide, manganese oxide, cobalt oxide, nickel oxide, copper oxide, gallium oxide, copper strontium oxide, niobium oxide, molybdenum oxide, copper indium oxide, silver indium oxide, and iridium oxide.

In the charge blocking layer 107b composed of plural layers, it is preferable that in the plural a layers, the layer adjacent to the photoelectric conversion layer 107a is a layer made of the same material as the p-type organic semiconductor which is contained in the photoelectric conversion layer 107a. By using the same p-type organic semiconductor in the charge blocking layer 107b, the formation of an intermediate level at an interface of the layer adjacent to the photoelectric conversion layer 107a is inhibited, so that a dark current can be more inhibited.

In the case where the charge blocking layer 107b is a single layer, the layer can be a layer made of an inorganic material. In the case where the charge blocking layer 107b is composed of plural layers, one or two or more layers can be a layer made of an inorganic material.

It is preferable to use a compound represented by the following general formula (1-A1) or general formula (1-A2) as the material which is used in the charge blocking layer 107b.

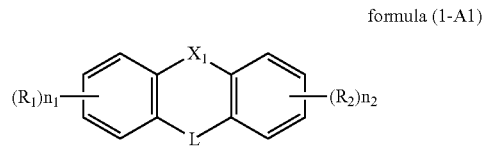

formula (1-A1)

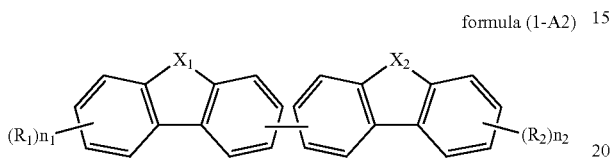

formula (1-A2)

In the general formulae (1-A1) and (1-A2), each of R1 and R2 independently represents a heterocyclic group which may be substituted with an alkyl group. Each of X1 and X2 independently represents a carbon atom, a nitrogen atom, an oxygen atom, a sulfur atom, or a silicon atom, each of which may further have a substituent. L represents a single bond, an oxygen atom, a sulfur atom, an alkylene group, an alkenylene group, a cycloalkylene group, a cycloalkenylene group, an arylene group, a divalent heterocyclic group, or an imino group, each of which may further have a substituent. Each of n1 and n2 independently represents an integer of from 1 to 4.

The heterocyclic group represented by each of R1 and R2 may contain a condensed ring composed of from 2 to 5 single rings. Also, the heterocyclic group has preferably from 6 to 30 carbon atoms, and more preferably from 6 to 20 carbon atoms.

Also, the alkyl group which may substitutes on the heterocyclic group is preferably an alkyl group having from 1 to 6 carbon atoms. The alkyl group may be a linear or branched alkyl group or a cyclic alkyl group (cycloalkyl group), and plural alkyl groups may be bonded to each other to form a ring (for example, a benzene ring). The alkyl group is preferably a branched alkyl group. Specific examples of the alkyl group include a methyl group, an ethyl group, an isopropyl group, a t-butyl group, and a neopentyl group.

L represents a single bond, an oxygen atom, a sulfur atom, an alkylene group, an alkenylene group, a cycloalkylene group, a cycloalkenylene group, an arylene group, a divalent heterocyclic group, or an imino group. L is preferably a single bond, an alkylene group having from 1 to 12 carbon atoms, an alkenylene group having from 2 to 12 carbon atoms (for example, —CH═CH—), an arylene group (for example, a 1,2-phenylene group or a 2,3-naphthylene group), a heterocyclic group having from 4 to 13 carbon atoms, an oxygen atom, a sulfur atom, or an imino group having a hydrocarbon group having from 1 to 12 carbon atoms (preferably, an aryl group or an alkyl group) (for example, a phenylimino group, a methylimino group, or a t-butylimino group); more preferably a single bond, an alkylene group having from 1 to 6 carbon atoms (for example, a methylene group, a 1,2-ethylene group, or a 1,1-dimethylmethylene group), an oxygen atom, a sulfur atom, or an imino group having from 1 to 6 carbon atoms; and especially preferably a single bond or an alkylene group having from 1 to 6 carbon atoms.

When L represents an alkylene group, an alkenylene group, a cycloalkylene group, a cycloalkenylene group, an arylene group, a divalent heterocyclic group, or an imino group, such a group may further have a substituent. Examples of the further substituent include an alkyl group, a halogen atom, an aryl group, and a heterocyclic group.

Examples of the heterocyclic group which may be substituted with an alkyl group, as represented by each of R1 and R2, include the following N1 to N15. Of these, N13 is preferable.

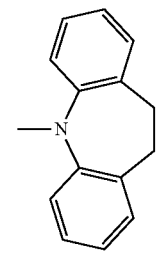

N1

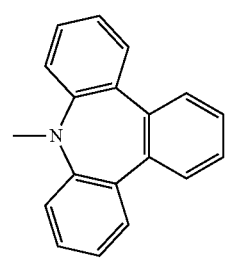

N2

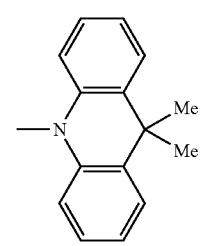

N3

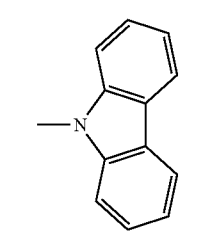

N4

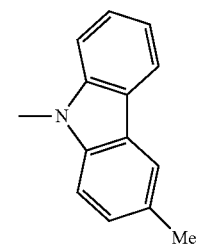

N5

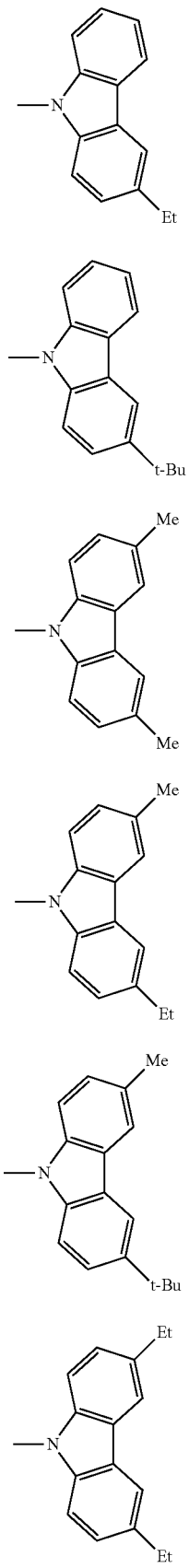
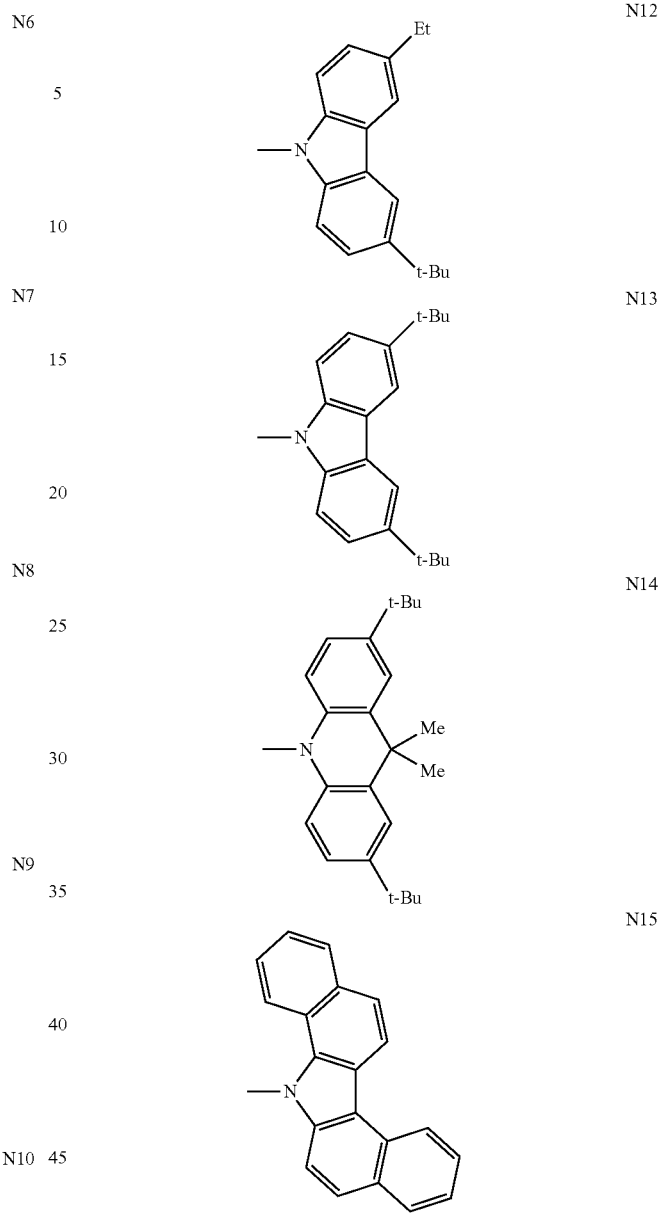

The substituent which each of X1 and X2 has is preferably an alkyl group or an aryl group.

The alkyl group is preferably an alkyl group having from 1 to 4 carbon atoms, and examples thereof include a methyl group, an ethyl group, an n-propyl group, an isopropyl group, and a t-butyl group. Of these, a methyl group is more preferable.

The aryl group is preferably an aryl group having from 6 to 20 carbon atoms. The aryl group may have an alkyl group and is preferably an aryl group having from 6 to 15 carbon atoms, which may have an alkyl group having from 1 to 4 carbon atoms. Examples of the aryl group include a phenyl group, a naphthyl group, an anthracenyl group, a 9-dimethylfluorenyl group, a methylphenyl group, and a dimethylphenyl group. Of these, a phenyl group, a naphthyl group, an anthracenyl group, or a 9-dimethylfluorenyl group is preferable.

Compounds represented by the following formulae are especially preferable as the material of the electron blocking layer.

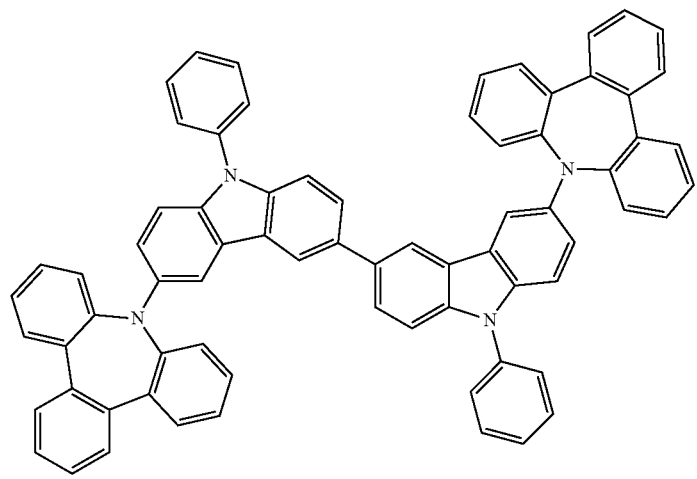
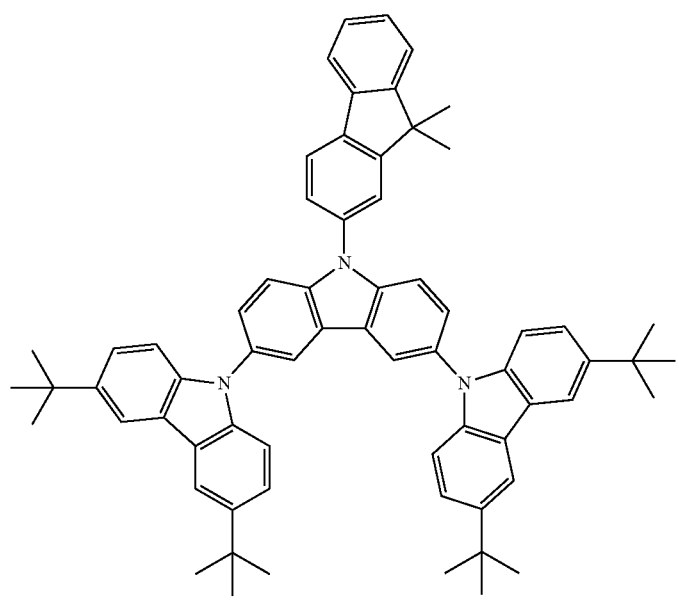
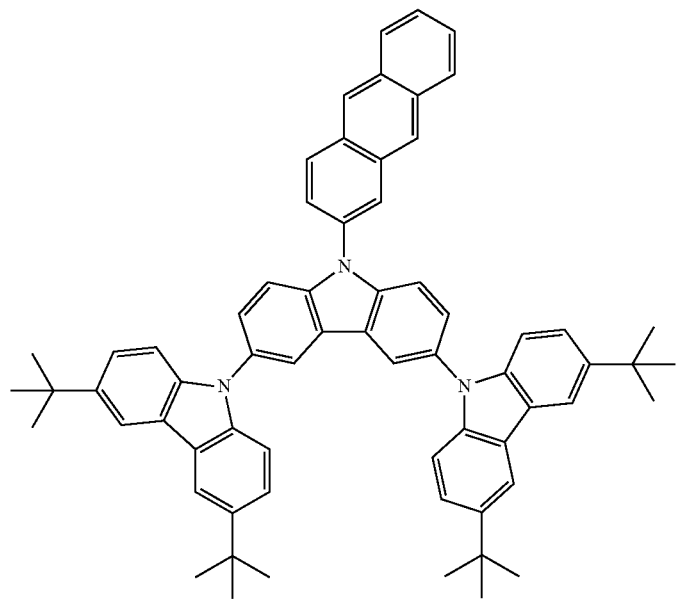

-continued
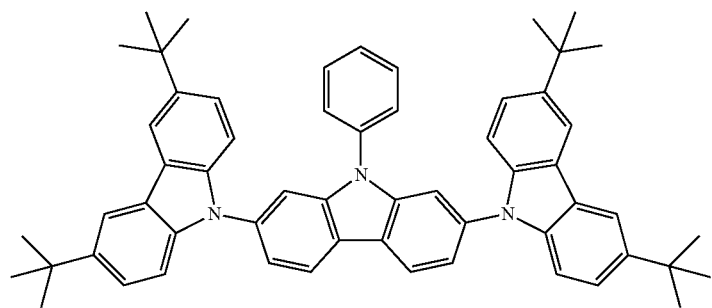
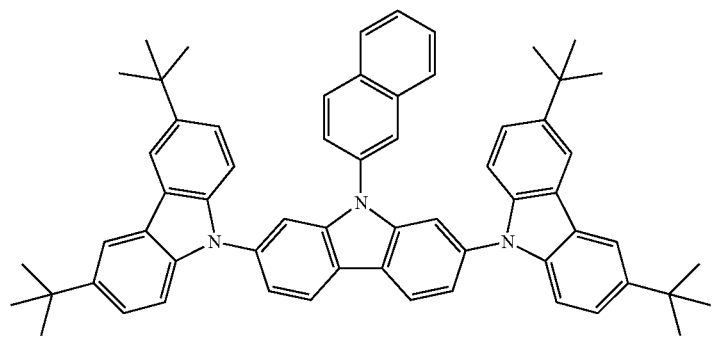
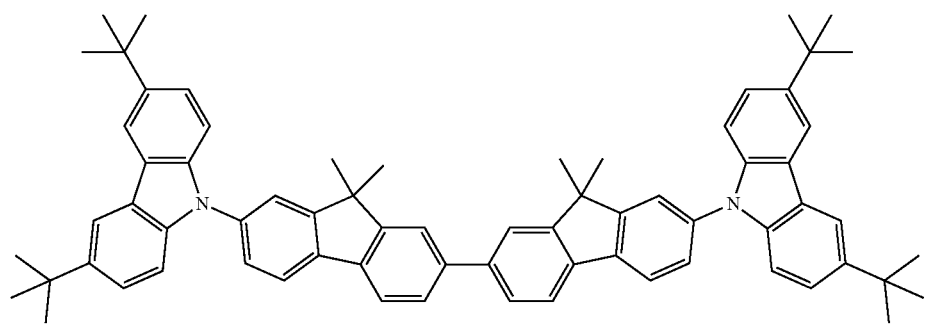
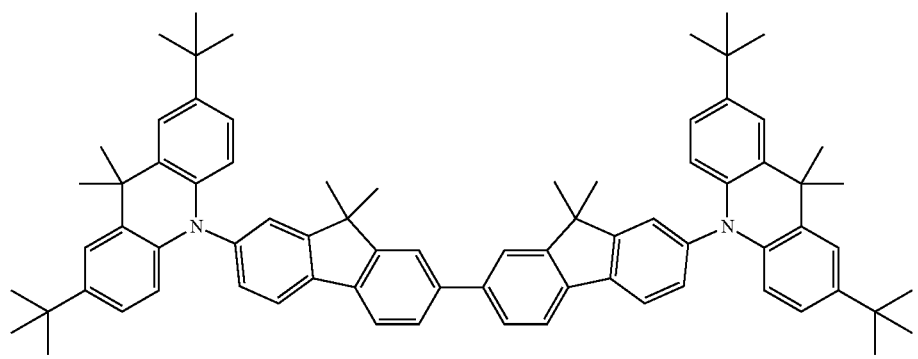

-continued

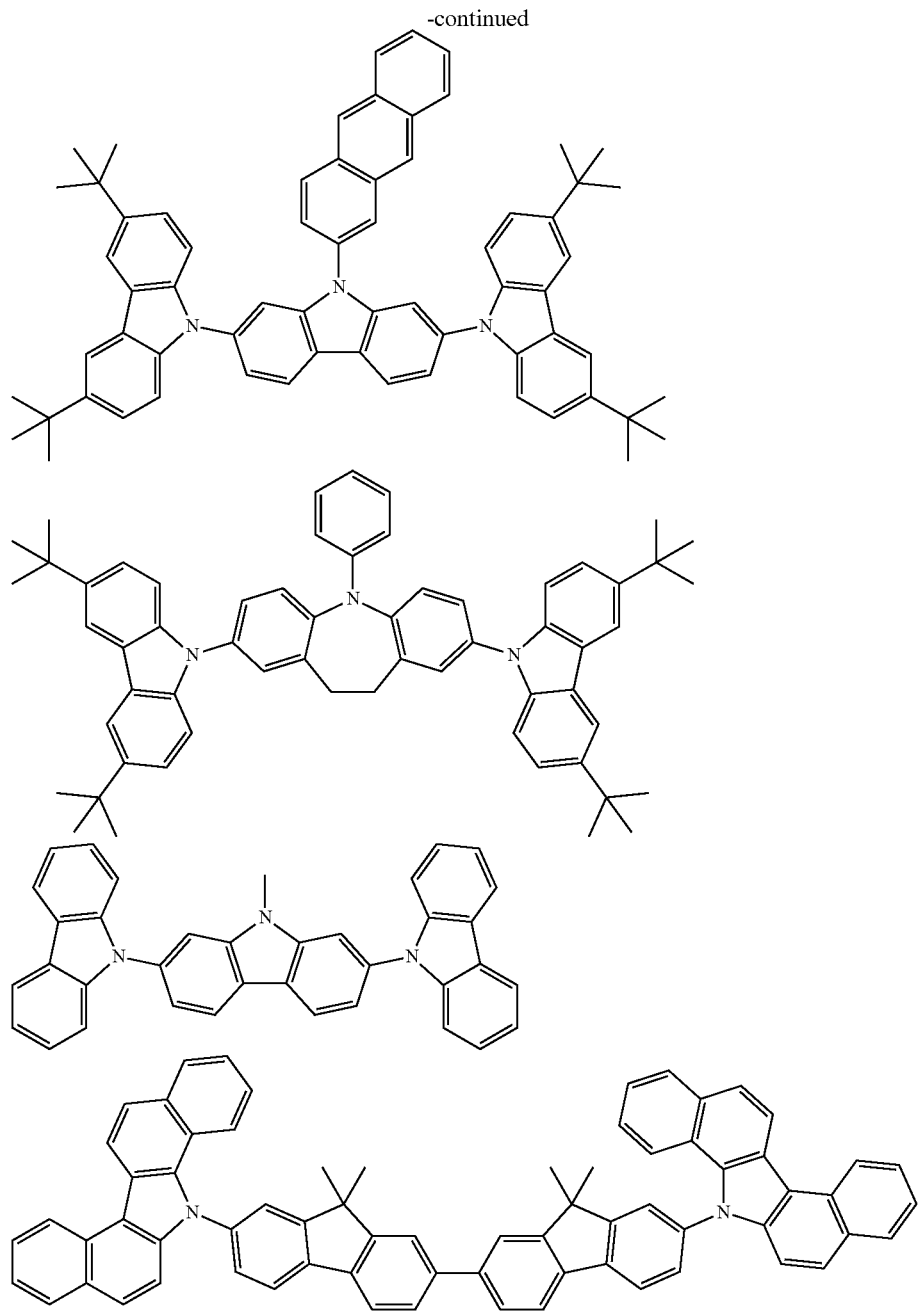

The solid-state imaging element 100 having the foregoing configuration is manufactured in the following manner.

First of all, the substrate 101 in which the insulating layer 102 including the connection parts 105 and 106 shown in FIG. 1 is prepared, and TiON is film-formed on the insulating layer 102 of this substrate 101 by means of a sputtering method.

Subsequently, the TiON film is subjected to patterning by means of photolithography and etching in such a manner that the TiON film remains on the connection parts 106 and 105, thereby forming a plurality of the pixel electrodes 104 and a plurality of the connection electrodes 103. Incidentally, it is preferable to perform this patterning under vacuum taking into consideration prevention adhesion of a deterioration factor of the light receiving layer to the substrate from occurring.

After forming a plurality of the pixel electrodes 104 and a plurality of the connection electrodes 103, an insulating film is formed thereon and then flattened, thereby accomplishing the insulating layer 102 having the configuration shown in FIG. 2.

Subsequently, the substrate 101 is heated at a temperature higher than a heating temperature in a step where the heating temperature is highest in the heating step to be performed after forming the counter electrode 108. At that time, the heating temperature and the heating time are set up so as to meet at least one of the foregoing requirements (1) to (4).

After completion of heating of the substrate 101, the light receiving layer 107, the counter electrode 108, the buffer layer 109, the sealing layer 110, the color filters 111, and the protective layer 114 are successively formed, thereby accomplishing the solid-state imaging element 100.

According to such a manufacturing method, denaturation of the pixel electrode 104 is prevented in the heating step to be performed after forming the photoelectric conversion element, whereby the heat resistance of the solid-state imaging element 100 can be enhanced.

Incidentally, the solid-state imaging element 100 may also be manufactured in the following manner.

First all, the substrate 101 in which the insulating layer 102 including the connection parts 105 and 106 shown in FIG. 1 is prepared, and TiON is film-formed on the insulating layer 102 of this substrate 101 by means of a CVD method. At that time, the condition of CVD is set up so as to meet at least one of the foregoing requirements (1) to (4).

Subsequently, the TiON film is subjected to patterning by means of photolithography and etching in such a manner that the TiON film remains on the connection pats 106 and 105, thereby forming a plurality of the pixel electrodes 104 and a plurality of the connection electrodes 103.

After forming a plurality of the pixel electrodes 104 and a plurality of the connection electrodes 103, an insulating film is formed thereon and then flattened, thereby accomplishing the insulating layer having the configuration shown in FIG. 2.

Subsequently, the light receiving layer 107, the counter electrode 108, the buffer layer 109, the sealing layer 110, the color filters 111, and the protective layer 114 are successively formed without performing a treatment of heating the substrate 101, thereby accomplishing the solid-state imaging element 100.

Even according to such a manufacturing method, denaturation of the pixel electrode 104 is prevented in the heating step to be performed after forming the photoelectric conversion element, whereby the heat resistance of the solid-state imaging element 100 can be enhanced.

The effects of the invention are hereunder described by reference to the Examples.

EXAMPLES

Example 1

On a CMOS substrate having a signal read-out circuit, in which an insulating film (including a connection part) made of SiO2 was formed on the surface thereof, titanium oxynitride (TiON) was film-formed in a thickness of 15 nm by means of a sputtering method, and this film was subjected to patterning by means of photolithography and dry etching method, thereby forming pixel electrodes. Incidentally, the pixel electrodes are electrically connected to the signal read-out circuit within the substrate through connection parts within the insulating film. Thereafter, this substrate was heated in the air at 300° C. for 30 minutes.

Thereafter, the following Compound 2 was film-formed in a thickness of 100 nm by means of a vacuum thermal vapor deposition method, thereby forming an electron blocking layer. Thereafter, the following Compound 1 and C60 were film-formed in a ratio of 1:2 as reduced into a single film by means of a vapor co-deposition method, thereby forming a light receiving layer.

Thereafter, ITO was film-formed in a thickness of 10 nm by means of a sputtering method, thereby forming a counter electrode; alumina was film-formed in a thickness of 200 nm thereon by means of an ALCVD method, thereby forming a buffer layer; and a silicon oxynitride film was film-formed in a thickness of 100 nm thereon by means of a sputtering method, thereby forming a sealing layer. There was thus fabricated a solid-state imaging element having up to the sealing layer shown in FIG. 1.

Examples 2 and 4 to 7

Solid-state image elements were fabricated in the same manner as that in Example 1, except for changing the material of the electron blocking layer, the material of the photoelectric conversion layer and the substrate heating temperature in the heating treatment of pixel electrodes before forming the light receiving layer as shown in Table 1. As for an expression "/*" shown in the column of "Light receiving layer configuration" in Table 1, "" shows an electron blocking layer, and "*" shows a photoelectric conversion layer.

Example 3

On a CMOS substrate the same as that used in Example 1, titanium oxynitride (TiON) was film-formed in a thickness of 15 nm by means of a CVD method, and this film was subjected to patterning by means of photolithography and dry etching method, thereby forming pixel electrodes. Incidentally, the pixel electrodes are electrically connected to the signal read-out circuit within the substrate through connection parts within the insulating film.

Thereafter, the following Compound 2 was film-formed in a thickness of 100 nm on the substrate by means of a vacuum thermal vapor deposition method, thereby forming an electron blocking layer. Thereafter, a photoelectric conversion layer, et seq. were formed in the same manner as that in Example 1. There was thus fabricated a solid-state imaging element having up to the sealing layer shown in FIG. 1.

Comparative Examples 1 to 4

Solid-state imaging elements were fabricated in the same manner as that in Example 3, except for changing the film forming method of titanium oxynitride to a sputtering method and changing the materials of the electron blocking layer and the photoelectric conversion layer to those described in Table 1.

Comparative Example 5

A solid-state imaging element was fabricated in the same manner as that in Example 1, except for changing the substrate heating temperature in the heat treatment of the pixel electrodes before forming the light receiving layer to 250° C.

Comparative Example 6

A solid-state imaging element was fabricated in the same manner as that in Example 1, except for changing the substrate heating temperature in the heat treatment of the pixel electrodes before forming the light receiving layer to 260° C.

TABLE 1

| | Light receiving layer configuration | Film forming method of pixel electrode | Heat treatment of pixel electrode | Oxygen concentration in a thickness of 10 nm from the substrate side of pixel electrode (atm % relative to Ti) | |
|---|---|---|---|---|---|
| | | | | At a point of time of electrode formation | After heat treatment of substrate |
| Example 1 | Compound 2/Compound 1 + C60 | Sputtering | 300° C. for 30 minutes | 29% | 46% |
| Example 2 | Compound 2/Compound 1 + C60 | Sputtering | 350° C. for 30 minutes | 29% | 71% |
| Example 3 | Compound 2/Compound 1 + C60 | CVD | Nil | 61% | — |
| Example 4 | Compound 3/Compound 1 + C60 | Sputtering | 300° C. for 30 minutes | 29% | 46% |
| Example 5 | Compound 2/Compound 4 + C60 | Sputtering | 300° C. for 30 minutes | 29% | 46% |
| Example 6 | Compound 2/Compound 5 + C60 | Sputtering | 300° C. for 30 minutes | 29% | 46% |
| Example 7 | Compound 2/Compound 1 + C60 | Sputtering | 280° C. for 30 minutes | 29% | 41% |
| Comparative Example 1 | Compound 2/Compound 1 + C60 | Sputtering | Nil | 29% | — |
| Comparative Example 2 | Compound 3/Compound 1 + C60 | Sputtering | Nil | 29% | — |
| Comparative Example 3 | Compound 2/Compound 4 + C60 | Sputtering | Nil | 29% | — |
| Comparative Example 4 | Compound 2/Compound 5 + C60 | Sputtering | Nil | 29% | — |
| Comparative Example 5 | Compound 2/Compound 1 + C60 | Sputtering | 250° C. for 30 minutes | 29% | 34% |
| Comparative Example 6 | Compound 2/Compound 1 + C60 | Sputtering | 260° C. for 30 minutes | 29% | 36% |

| | Nitrogen concentration in a thickness of 10 nm from the substrate side of pixel electrode (atm % relative to Ti) | | Oxygen concentration of the whole of pixel electrode (atm % relative to Ti) | | Nitrogen concentration of the whole of pixel electrode (atm % relative to Ti) | | Dark current density after annealing at 220° C. (relative value when a value immediately after fabrication of each element was defined as 1) |
|---|---|---|---|---|---|---|---|
| | At a point of time of electrode formation | After heat treatment of substrate | At a point of time of electrode formation | After heat treatment of substrate | At a point of time of electrode formation | After heat treatment of substrate | |
| Example 1 | 101% | 87% | 70% | 88% | 83% | 71% | 0.48 |
| Example 2 | 101% | 75% | 70% | 107% | 83% | 61% | 0.47 |
| Example 3 | 42% | — | 78% | — | 48% | — | 0.50 |
| Example 4 | 101% | 87% | 70% | 88% | 83% | 71% | 0.43 |
| Example 5 | 101% | 87% | 70% | 88% | 83% | 71% | 0.94 |
| Example 6 | 101% | 87% | 70% | 88% | 83% | 71% | 0.30 |
| Example 7 | 101% | 88% | 70% | 81% | 83% | 72% | 0.57 |
| Comparative Example 1 | 101% | — | 70% | — | 83% | — | 3.44 |
| Comparative Example 2 | 101% | — | 70% | — | 83% | — | 3.33 |
| Comparative Example 3 | 101% | — | 70% | — | 83% | — | 4.18 |
| Comparative Example 4 | 101% | — | 70% | — | 83% | — | 3.13 |
| Comparative Example 5 | 101% | 92% | 70% | 72% | 83% | 76% | 2.02 |
| Comparative Example 6 | 101% | 91% | 70% | 73% | 83% | 74% | 1.61 |

COMPOUND 1

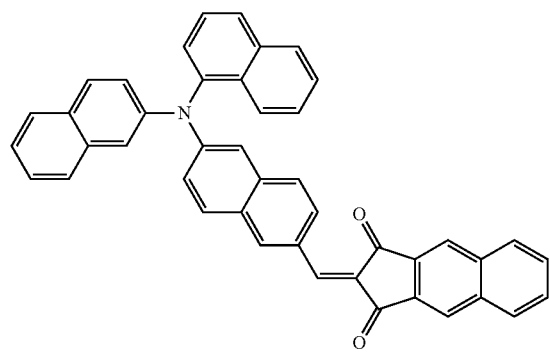

COMPOUND 2 COMPOUND 3

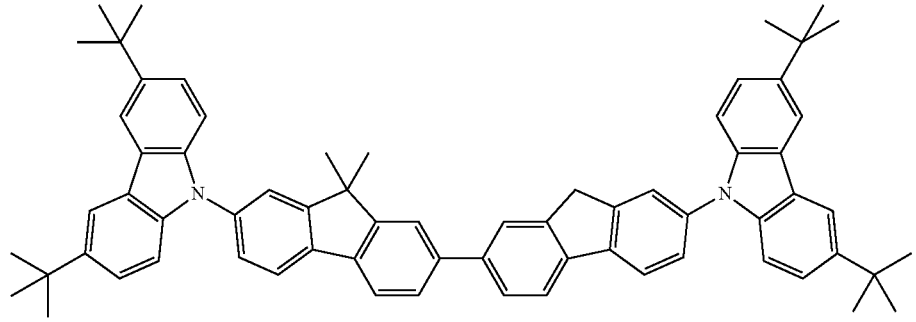

COMPOUND 4

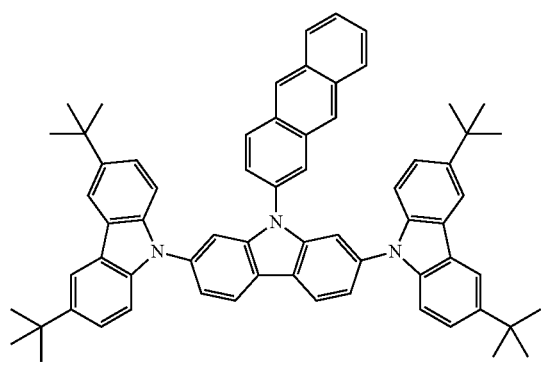
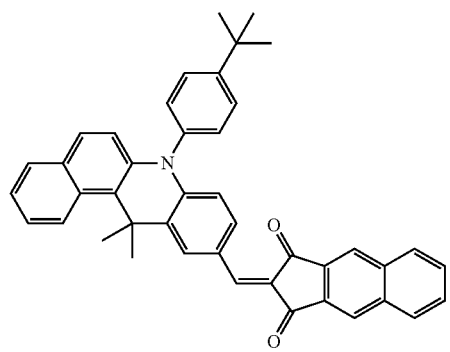

COMPOUND 5

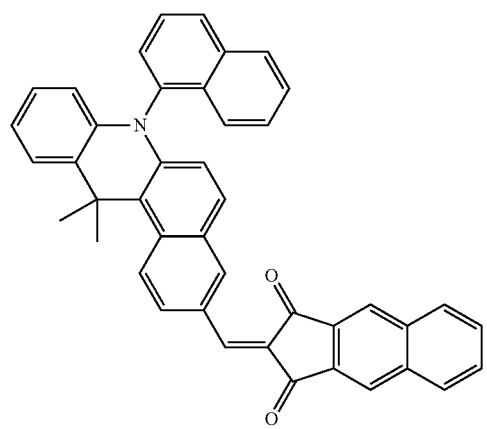

As for the solid-state imaging elements of Examples 1, 2 and 4 to 7 and Comparative Examples 5 and 6, the composition of the pixel electrode before and after heating prior to the formation of the light receiving layer was measured; and as for other solid-state imaging elements, the composition of the pixel electrode prior to the formation of the light receiving layer was measured. The results are shown in Table 1. Also, as for all of the fabricated solid-state imaging elements, in the case of impressing an electric field of $2\times10^5$ V/cm to a minus direction on the pixel electrode side, the dark current density was measured after completion of the fabrication of the solid-state imaging element and after heating the solid-state imaging element at 220° C. of the same temperature in the heating step to be performed in a post-step for 30 minutes, respectively, and the measurement result after heating is shown as a relative value to the measurement result before heating.

As shown in Table 1, the dark current in the Comparative Examples 1 to 6 which do not meet any of the foregoing requirements (1) to (4) is significantly increased by the heating step at 220° C. for 30 minutes. On the other hand, all of the solid-state imaging elements of Examples 1 to 7 meet any one of the foregoing requirements (1) to (4) and it was noted that the dark current does not increase even after the heating step, and the heat resistance is enhanced.

Also, as compared with Comparative Example 6 in which the pixel electrode is heated at 260° C., in Example 7 in which the pixel electrode is heated at 280° C., the dark current greatly decreases. In view of this fact, it was noted that in the case of heating the pixel electrode at a temperature of 270° C. or higher, an effect for enhancing the heat resistance is obtained.

Incidentally, the manufacturing methods of JP-A-2005-085933, JP-A-2008-072435, and JP-A-2008-072589 are concerned with the working examples in which the pixel electrode is ITO, a premise of which is significantly different from that of the present application in which the pixel electrode is constituted of TiON. In consequence, it is not easy to obtain the pixel electrode having a composition specified in the present invention from the inventions described in JP-A-2005-085933, JP-A-2008-072435, and JP-A-2008-072589. Also, the temperature for heating the substrate is a temperature necessary for drying, and a relation with the maximum temperature in the subsequent heating step is not considered.

Also, JP-A-2009-071057 and JP-A-11-326038 describe that the pixel electrode (including TiO2) is formed by means of a CVD method. However, these patent documents do not describe TiON. Also, in TiO2, although there is a possibility of incorporation of oxygen from the insulating film by the heating step, there is no possibility that the nitrogen gas volatilizes dues to this incorporation.

For that reason, in the pixel electrodes of JP-A-2009-071057 and JP-A-11-326038, it is not necessary to specify the oxygen content or nitrogen content, and it is not easy to accomplish the present invention from the inventions described in these patent documents.

As described above, the following items are disclosed in the present specification.

The disclosed photoelectric conversion element is a photoelectric conversion element comprising a substrate having thereon an insulating film constituted of an oxide film, a first electrode formed on the insulating film, an organic material-containing light receiving layer formed on the first electrode, and a second electrode formed on the light receiving layer, wherein the first electrode is constituted of titanium oxynitride, and a composition of the first electrode just before forming the light receiving layer meets (1) a requirement that an amount of oxygen contained in the whole of the first electrode is 75 atm % or more of an amount of titanium, or (2) a requirement that in a range of from the substrate side of the first electrode to 10 nm or a range of from the substrate side of the first electrode to ⅔ of the thickness of the first electrode, an amount of oxygen is 40 atm % or more of an amount of titanium.

The disclosed photoelectric conversion element is one in which a composition of the first electrode just before forming the light receiving layer further meets (3) a requirement that an amount of nitrogen contained in the whole of the first electrodes is 73 atm % or less of an amount of titanium, or (4) a requirement that in a range of from the substrate side of the first electrode to 10 nm or a range of from the substrate side of the first electrode to ⅔ of the thickness of the first electrode, an amount of nitrogen is not more than 90 atm % of an amount of titanium.

The disclosed photoelectric conversion element is a photoelectric conversion element comprising a substrate having thereon an insulating film constituted of an oxide film, a first electrode formed on the insulating film, an organic material-containing light receiving layer formed on the first electrode, and a second electrode formed on the light receiving layer, wherein the first electrode is constituted of titanium oxynitride, and a composition of the first electrode just before forming the light receiving layer meets (1) a requirement that an amount of nitrogen contained in the whole of the first electrode is 73 atm % or less of an amount of titanium, or (2) a requirement that in a range of from the substrate side of the first electrode to 10 nm or a range of from the substrate side of the first electrode to ⅔ of the thickness of the first electrode, an amount of nitrogen is not more than 90 atm % of an amount of titanium.

The disclosed photoelectric conversion element is one in which a plurality of the first electrodes are arranged and formed on the insulating film, and the light receiving layer is formed to cover the plural first electrodes.

The disclosed photoelectric conversion element is one in which the light receiving layer includes an organic material-containing charge blocking layer and an organic material-containing photoelectric conversion layer.

The disclosed solid-state imaging element is one comprising the foregoing photoelectric conversion element and a signal read-out circuit formed on the substrate, which reads out a signal in response to a charge amount of charge generated within the light receiving layer and collected by the first electrode.

The disclosed imaging apparatus is one comprising the foregoing solid-state imaging element.

The disclosed manufacturing method of a photoelectric conversion element is a method for manufacturing a photoelectric conversion element including a substrate having thereon an insulating film constituted of an oxide film, a first electrode formed on the insulating film, an organic material-containing light receiving layer formed on the first electrode, and a second electrode formed on the light receiving layer, which comprises a first step of forming the first electrode on the insulating film; a second step of forming the light receiving layer on the first electrode; and a third step of forming the second electrode on the light receiving layer, wherein in the first step, after completion of the first step, the first electrode is formed so as to meet (1) a requirement that an amount of oxygen contained in the whole of the first electrode is 75 atm % or more of an amount of titanium, or (2) a requirement that in a range of from the substrate side of the first electrode to 10 nm or a range of from the substrate side of the first electrode to ⅔ of the thickness of the first electrode, an amount of oxygen is 40 atm % or more of an amount of titanium.

The disclosed manufacturing method of a photoelectric conversion element is one in which in the first step, the first electrode is formed so as to further meet (3) a requirement that an amount of nitrogen contained in the whole of the first electrodes is 73 atm % or less of an amount of titanium, or (4) a requirement that in a range of from the substrate side of the first electrode to 10 nm or a range of from the substrate side of the first electrode to ⅔ of the thickness of the first electrode, an amount of nitrogen is not more than 90 atm % of an amount of titanium.

The disclosed manufacturing method of a photoelectric conversion element is a method for manufacturing a photoelectric conversion element including a substrate having thereon an insulating film constituted of an oxide film, a first electrode formed on the insulating film, an organic material-containing light receiving layer formed on the first electrode, and a second electrode formed on the light receiving layer, which comprises a first step of forming the first electrode on the insulating film; a second step of forming the light receiving layer on the first electrode; and a third step of forming the second electrode on the light receiving layer, wherein in the first step, after completion of the first step, the first electrode is formed so as to meet (1) a requirement that an amount of nitrogen contained in the whole of the first electrode is 73 atm % or less of an amount of titanium, or (2) a requirement that in a range of from the substrate side of the first electrode to 10 nm or a range of from the substrate side of the first electrode to ⅔ of the thickness of the first electrode, an amount of nitrogen is not more than 90 atm % of an amount of titanium.

The disclosed manufacturing method of a photoelectric conversion element is a method for manufacturing a photoelectric conversion element in which in the first step, a plurality of the first electrodes are arranged and formed on the insulating film, and in the second step, the light receiving layer is formed to cover the plural first electrodes.

The disclosed manufacturing method of a photoelectric conversion element is one in which the first step is constituted of a step of film-forming the titanium oxynitride on the insulating film by a sputtering method, a step of patterning a film of the film-formed titanium oxynitride, and a step of after patterning, heating the substrate at 270° C. or higher.

The disclosed manufacturing method of a photoelectric conversion element is one in which the first step is constituted of a step of film-forming the titanium oxynitride on the insulating film by a CVD (chemical vapor deposition) method and a step of patterning a film of the film-formed titanium oxynitride.

DESCRIPTION OF LETTERS OR NUMERALS

100: Solid-state imaging element
101: Substrate
102: Insulating layer
104: Pixel electrode
107: Light receiving layer
108: Counter electrode

What is claimed is:

1. A photoelectric conversion element comprising:
   an insulating film that is formed on a substrate and is made of an oxide film;
   a first electrode that is formed on the insulating film;
   a light receiving layer that is formed on the first electrode and includes an organic material; and
   a second electrode that is formed on the light receiving layer,
   wherein the first electrode is made of titanium oxynitride, and
   a composition of the first electrode just before forming the light receiving layer meets
   (1) a requirement that an amount of oxygen contained in the whole of the first electrode is 75 atm % or more of an amount of titanium, or
   (2) a requirement that in a range of from the substrate side of the first electrode to 10 nm or a range of from the substrate side of the first electrode to ⅔ of the thickness of the first electrode, an amount of oxygen is 40 atm % or more of an amount of titanium.

2. The photoelectric conversion element according to claim 1, wherein
   a composition of the first electrode just before forming the light receiving layer further meets
   (3) a requirement that an amount of nitrogen contained in the whole of the first electrodes is 73 atm % or less of an amount of titanium, or
   (4) a requirement that in a range of from the substrate side of the first electrode to 10 nm or a range of from the substrate side of the first electrode to ⅔ of the thickness of the first electrode, an amount of nitrogen is 90 atm % or less of an amount of titanium.

3. The photoelectric conversion element according to claim 1,
   wherein a plurality of the first electrodes are arranged and formed on the insulating film, and the light receiving layer is formed to cover the plural first electrodes.

4. The photoelectric conversion element according to of claim 1,
   wherein the light receiving layer includes an organic material-containing charge blocking layer and an organic material-containing photoelectric conversion layer.

5. A solid-state imaging element comprising:
   the photoelectric conversion element according to claim 1; and
   a signal read-out circuit formed on the substrate, which reads out a signal in response to a charge amount of charge generated within the light receiving layer and collected by the first electrode.

6. An imaging apparatus comprising the solid-state imaging element according to claim 5.

7. A method for manufacturing a photoelectric conversion element including a substrate having thereon an insulating film made of an oxide film, a first electrode formed on the insulating film, a light receiving layer formed on the first electrode and including an organic material, and a second electrode formed on the light receiving layer, the method comprising:
   forming the first electrode on the insulating film,
   forming the light receiving layer on the first electrode, and
   forming the second electrode on the light receiving layer, wherein
   in the forming step of the first electrode, the first electrode is formed so as to meet
   (1) a requirement that an amount of oxygen contained in the whole of the first electrode is 75 atm % or more of an amount of titanium, or
   (2) a requirement that in a range of from the substrate side of the first electrode to 10 nm or a range of from the substrate side of the first electrode to ⅔ of the thickness of the first electrode, an amount of oxygen is 40 atm % or more of an amount of titanium.

8. The method for manufacturing a photoelectric conversion element according to claim 7, wherein
   in the forming step of the first electrode, the first electrode is formed so as to further meet
   (3) a requirement that an amount of nitrogen contained in the whole of the first electrodes is 73 atm % or less of an amount of titanium, or
   (4) a requirement that in a range of from the substrate side of the first electrode to 10 nm or a range of from the substrate side of the first electrode to ⅔ of the thickness of the first electrode, an amount of nitrogen is 90 atm % or less of an amount of titanium.

9. The method for manufacturing a photoelectric conversion element according to claim 7, wherein in the forming step of the first electrode, a plurality of the first electrodes are arranged and formed on the insulating film, and in the forming step of the light receiving layer, the light receiving layer is formed to cover the plural first electrodes.

10. The method for manufacturing a photoelectric conversion element according to claim 9, wherein the first forming step of the first electrode includes a step of film-forming the titanium oxynitride on the insulating film by a sputtering method, a step of patterning a film of the film-formed titanium oxynitride, and a step of after patterning, heating the substrate at 270° C. or higher.

11. The method for manufacturing a photoelectric conversion element according to claim 9, wherein the forming step of the first electrode includes a step of film-forming the titanium oxynitride on the insulating film by a CVD (chemical vapor deposition) method and a step of patterning a film of the film-formed titanium oxynitride.

12. A method for manufacturing a photoelectric conversion element including a substrate having thereon an insulating film made of an oxide film, a first electrode formed on the insulating film, a light receiving layer formed on the first electrode and including an organic material, and a second electrode formed on the light receiving layer, the method comprising:
forming the first electrode on the insulating film,
forming the light receiving layer on the first electrode, and
forming the second electrode on the light receiving layer, wherein in the forming step of the first electrode, the first electrode is formed so as to meet
(1) a requirement that an amount of nitrogen contained in the whole of the first electrodes is 73 atm % or less of an amount of titanium, or
(2) a requirement that in a range of from the substrate side of the first electrode to 10 nm or a range of from the substrate side of the first electrode to ⅔ of the thickness of the first electrode, an amount of nitrogen is 90 atm % or less of an amount of titanium;
wherein in the forming step of the first electrode, a plurality of the first electrodes are arranged and formed on the insulating film, and in the forming step of the light receiving layer, the light receiving layer is formed to cover the plural first electrodes; and
the first forming step of the first electrode includes a step of film-forming the titanium oxynitride on the insulating film by a sputtering method, a step of patterning a film of the film-formed titanium oxynitride, and a step of after patterning, heating the substrate at 270° C. or higher.

13. The method for manufacturing a photoelectric conversion element according to claim 12, wherein the forming step of the first electrode includes a step of film-forming the titanium oxynitride on the insulating film by a CVD (chemical vapor deposition) method and a step of patterning a film of the film-formed titanium oxynitride.

* * * * *